US012500093B2

(12) United States Patent
Wu et al.

(10) Patent No.: US 12,500,093 B2
(45) Date of Patent: Dec. 16, 2025

(54) COMPOSITE PARTICULATES FOR USE AS PART OF A SUPPORTING FILL MIXTURE IN A SEMICONDUTOR SUBSTRATE STACKING APPLICATION

(71) Applicant: Taiwan Semiconductor Manufacturing Company, Ltd., Hsinchu (TW)

(72) Inventors: Kuo-Ming Wu, Zhubei (TW); Hau-Yi Hsiao, Chiayi (TW); Kai-Yun Yang, Tainan (TW); Che Wei Yang, New Taipei (TW); Sheng-Chau Chen, Tainan (TW); Chung-Yi Yu, Hsin-Chu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 419 days.

(21) Appl. No.: 18/308,036

(22) Filed: Apr. 27, 2023

(65) Prior Publication Data

US 2024/0162051 A1 May 16, 2024

Related U.S. Application Data

(60) Provisional application No. 63/383,617, filed on Nov. 14, 2022.

(51) Int. Cl.
*H01L 21/56* (2006.01)
*H01L 21/306* (2006.01)
*H01L 21/78* (2006.01)

(52) U.S. Cl.
CPC ...... *H01L 21/561* (2013.01); *H01L 21/30625* (2013.01); *H01L 21/78* (2013.01)

(58) Field of Classification Search
CPC . H01L 21/561; H01L 21/30625; H01L 21/78; H01L 25/50
See application file for complete search history.

(56) References Cited

U.S. PATENT DOCUMENTS

| | | | |
|---|---|---|---|
| 2007/0126097 A1 | 6/2007 | Lin | |
| 2018/0226390 A1* | 8/2018 | Kang | H01L 24/94 |
| 2019/0362980 A1* | 11/2019 | Shirono | H01L 24/94 |
| 2020/0006145 A1* | 1/2020 | Li | H01L 25/0655 |
| 2021/0091024 A1* | 3/2021 | Uozumi | H01L 24/05 |
| 2022/0028833 A1* | 1/2022 | Okubo | H01L 24/08 |
| 2023/0066183 A1* | 3/2023 | Sano | H01L 21/76251 |

\* cited by examiner

*Primary Examiner* — Thanh T Nguyen
(74) *Attorney, Agent, or Firm* — Harrity & Harrity, LLP

(57) ABSTRACT

Some implementations described herein include systems and techniques for fabricating a stacked die product. The systems and techniques include using a supporting fill mixture that includes a combination of types of composite particulates in a lateral gap region of a stack of semiconductor substrates and along a perimeter region of the stack of semiconductor substrates. One type of composite particulate included in the combination may be a relatively smaller size and include a smooth surface, allowing the composite particulate to ingress deep into the lateral gap region. Properties of the supporting fill mixture including the combination of types of composite particulates may control thermally induced stresses during downstream manufacturing to reduce a likelihood of defects in the supporting fill mixture and/or the stack of semiconductor substrates.

20 Claims, 13 Drawing Sheets

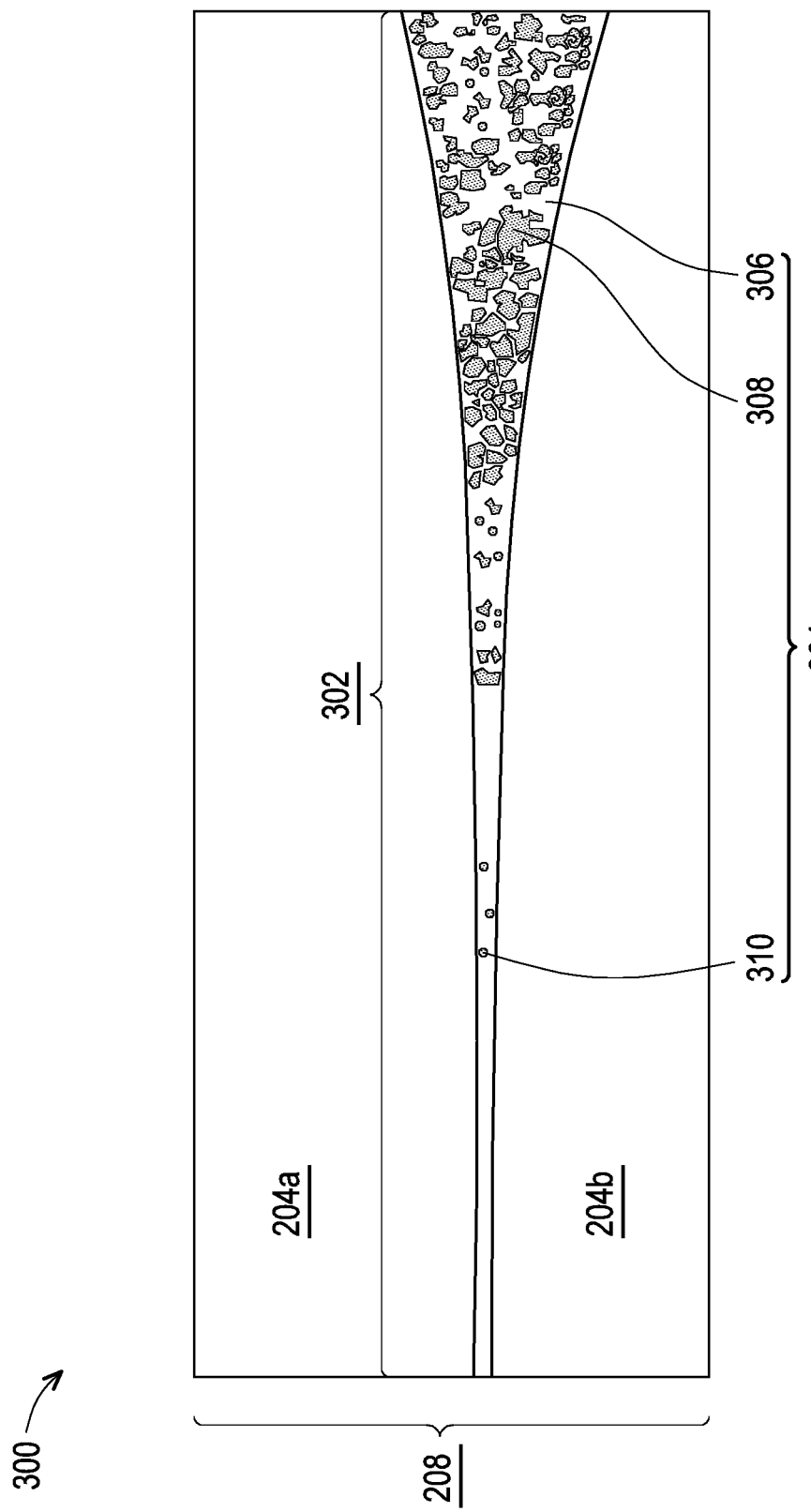

COMPOSITE PARTICULATES FOR USE AS PART OF A SUPPORTING FILL MIXTURE IN A SEMICONDUTOR SUBSTRATE STACKING APPLICATION

CROSS-REFERENCE TO RELATED APPLICATION

This Patent Application claims priority to Provisional Patent Application No. 63/383,617, filed on Nov. 14, 2022, and entitled "Composite Particulates for Use as Part of a Supporting Fill Mixture in a Semiconductor Substrate Stacking Application." The disclosure of the prior Applications is considered part of and is incorporated by reference into this Patent Applications.

BACKGROUND

A three dimensional integrated circuit (3DIC) assembly may include two or more integrated circuit (IC) dies that are stacked vertically and bonded along a bond line. The 3DIC assembly may be formed by stacking two or more semiconductor substrates including the two or more IC dies using a wafer bonding operation such as a Wafer-on-Wafer (WoW) bonding operation. After the bonding operation, the 3DIC assembly including the two or more IC dies may be diced from the stack of two or more semiconductor substrates and encapsulated in a semiconductor die package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are an example implementation of a supporting fill mixture including composite particulates described herein.

DETAILED DESCRIPTION

Figure 1:
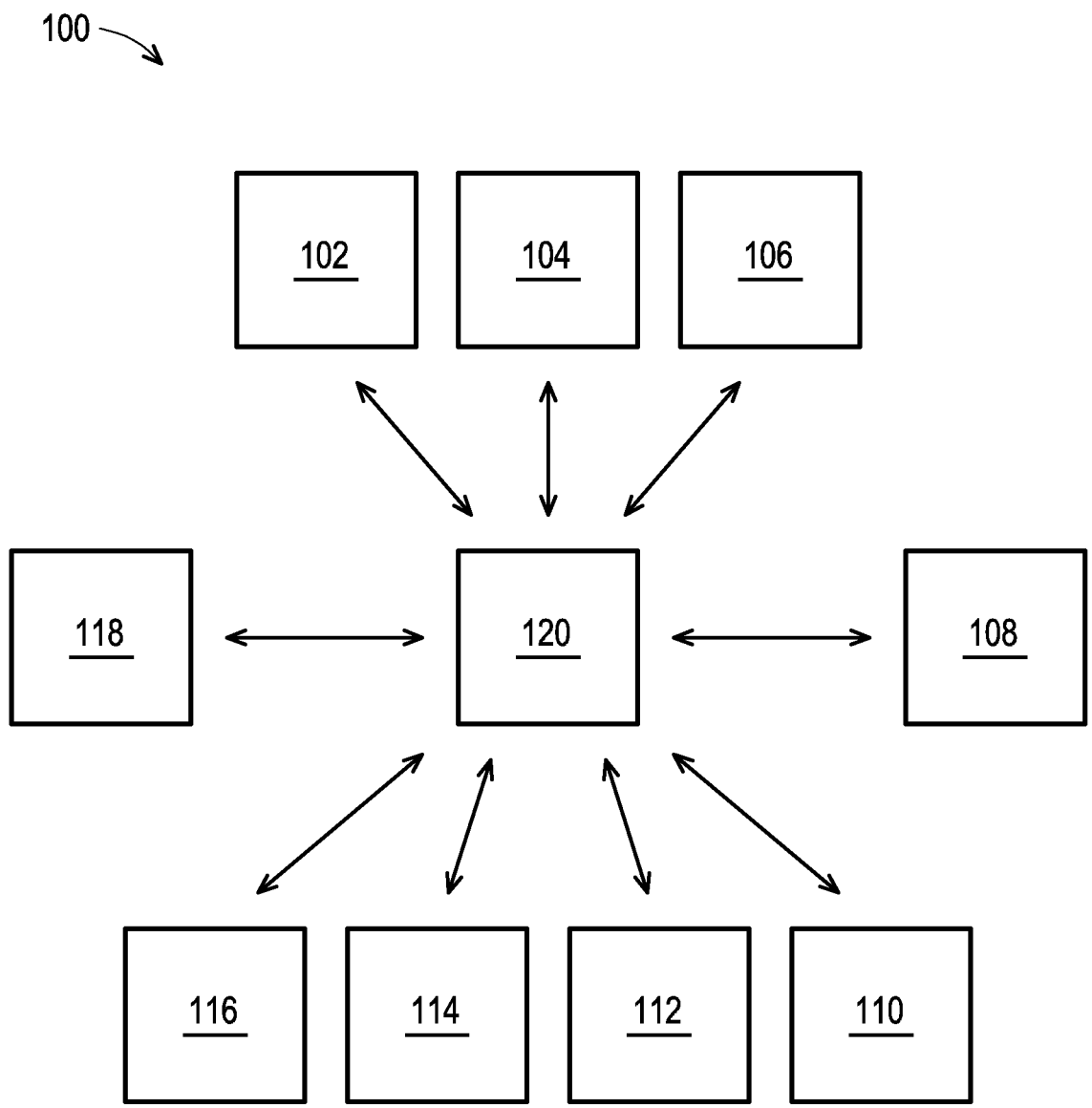
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a partially completed stack of semiconductor substrates (e.g., a WoW assembly) used to form a stacked integrated circuit die product may include a lateral gap region. The lateral gap region may be between beveled edges of the stack of semiconductor substrates and along a perimeter region of the stack of semiconductor substrates.

Due to the presence of the lateral gap, a mechanical robustness of the perimeter region may be such that a multi-step manufacturing process including a trimming operation, a grinding operation, and an amorphous silicon (a-Si) capping operation is implemented. The multi-step manufacturing process may reduce a likelihood of damage to the stack of semiconductor substrates during an operation that thins an upper semiconductor substrate. However, the multi-step manufacturing process may cause inefficiencies in the overall manufacturing of the stack of semiconductor substrates (e.g., a use of additional manufacturing tools and/or computing resources, among other examples). Additionally, the multi-step manufacturing process may increase a likelihood of defects and/or yield loss within the stack of semiconductor substrates due to trim-loss, trim wall exposure, and trim peeling that is inherent to the trimming operation.

In some cases, the lateral gap region may be filled with a sealant to improve a robustness of the stack of semiconductor substrates and improve an overall efficiency of the manufacturing process. However, the sealant may include one or more properties that cause defects within the sealant and along surfaces of the semiconductor substrates during high temperature processing downstream during back end of line (BEOL) operations. As an example, the defects may correspond to "Ruck-type" defects that include tearing of a polyimide (PI) or spin-on dielectric (SOD) material included in the sealant.

Some implementations described herein include systems and techniques for fabricating a stacked die product. The systems and techniques include using a supporting fill mixture that includes a combination of types of composite particulates in a lateral gap region of a stack of semiconductor substrates and along a perimeter region of the stack of semiconductor substrates. One type of composite particulate included in the combination may be a relatively smaller size and include a smooth surface, allowing the composite particulate to ingress deep into the lateral gap region. Properties of the supporting fill mixture including the combination of types of composite particulates may control thermally induced stresses during downstream manufacturing to reduce a likelihood of defects in the supporting fill mixture and/or the stack of semiconductor substrates.

In this way, the combination of types of composite particulates enables the supporting fill mixture and the stack of semiconductor substrates to incur fewer defects relative to another stack of semiconductor substrates that is formed using techniques that do not include using the combination of types of composite particulates. As such, a reduction in resources allocated to manufacturing a volume of the stacked die product may be reduced (e.g., a reduction in semiconductor manufacturing tools, a reduction in supporting computing resources, and/or a reduction in materials, among other examples).

FIG. 1 is a diagram of an example environment 100 in which systems and/or methods described herein may be implemented. As shown in FIG. 1, environment 100 includes a combination of semiconductor processing tools, including a deposition tool 102, an exposure tool 104, an etch tool 106, a bonding tool 108, a dispense tool 110, a planarization tool 112, a connection tool 114, an automated test equipment (ATE) tool 116, a singulation tool 118, and a transport tool 120. The semiconductor processing tools 102-118 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV (EUV) light source, and/or the like), an x-ray source, an electron beam source, and/or another type of radiation source. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The etch tool 106 is a semiconductor processing tool that is capable of etching various types of materials of a substrate, wafer, or semiconductor device. For example, the etch tool 106 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The bonding tool 108 is a semiconductor processing tool that is capable of bonding two or more wafers (or two or more semiconductor substrates, or two or more semiconductor devices) together. For example, the bonding tool 108 may include a eutectic bonding tool that is capable of forming a eutectic bond between two or more wafers. In these examples, the bonding tool 108 may heat the two or more wafers to form a eutectic system between the materials of the two or more wafers.

The dispense tool 110 may dispense one or more materials during fabrication of a semiconductor device. For example, the dispense tool 110 may include a pressurized jet nozzle that dispenses a polymer material between beveled edges of semiconductor substrates (e.g., wafers) as part of a multi semiconductor substrate stacking process.

The planarization tool 112 is a semiconductor processing tool that is capable of polishing or planarizing various layers of a wafer or semiconductor device. For example, the planarization tool 112 may include a chemical mechanical planarization (CMP) tool and/or another type of planarization tool that polishes or planarizes a layer or surface of deposited or plated material. The planarization tool may polish or planarize a surface of a semiconductor device with a combination of chemical and mechanical forces (e.g., chemical etching and free abrasive polishing). The planarization tool 112 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The connection tool 114 is a semiconductor processing tool that is capable of forming connection structures (e.g., electrically-conductive structures). The connection structures formed by the connection tool 114 may include a wire, a stud, a pillar, a bump, or a solder ball, among other examples. The connection structures formed by the connection tool 114 may include materials such as a gold (Au) material, a copper (Cu) material, a silver (Ag) material, a nickel (Ni) material, a tin (Sn) material, or a palladium (Pd) material, among other examples. The connection tool 114 may include a bumping tool, a wire-bond tool, or a plating tool, among other examples.

The ATE tool 116 is a semiconductor processing tool that is capable of testing a quality and a reliability of one or more integrated circuit dies and/or a semiconductor package (e.g., the one or more integrated circuit dies after encapsulation). The ATE tool 116 may perform wafer testing operations, known good die (KGD) testing operations, and/or semiconductor die package testing operations, among other examples. The ATE tool 116 may include a parametric tester tool, a speed tester tool, and/or a burn-in tool, among other examples. Additionally, or alternatively, the ATE tool 116 may include a prober tool and/or probe card tooling, among other examples.

The singulation tool 118 is a semiconductor processing tool that is capable of singulating (e.g., separating, removing) one or more integrated circuit dies from a wafer. For example, the singulation tool 118 may include a dicing tool, a sawing tool, and/or or a laser tool that cuts the one or more integrated circuit dies from the wafer, among other examples.

The transport tool 120 is a semiconductor processing tool capable of transporting work-in-process (WIP) between the semiconductor processing tools 102-118. The transport tool 120 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool 120 may also be configured to transfer and/or combine WIP amongst transport carriers. The transport tool 120 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool 120.

As described in greater detail in connection with FIGS. 2A-8 and elsewhere herein, the semiconductor processing tools 102-118 may perform a series of manufacturing operations related to using composite particulates in a supporting fill mixture as part of a multi semiconductor substrate (e.g., wafer) stacking process. For example, the series of manufacturing operations may include forming a first integrated circuit die on a first semiconductor substrate. The series of manufacturing operations includes forming a second integrated circuit die on a second semiconductor substrate. The series of manufacturing operations includes forming a stack of semiconductor substrates by joining the first semiconductor substrate and the second semiconductor substrate. The series of manufacturing operations includes forming a supporting fill mixture including a sealant mixed with first composite particulates of a first range of sizes and second composite particulates of a second range of sizes in a lateral gap region between beveled edges of the stack of semiconductor substrates, where a first median of the first range of sizes is greater relative to a second median of the second range of sizes. The series of manufacturing operations includes removing a stack of integrated circuit dies including the first integrated circuit die joined with the second integrated die from the stack of semiconductor substrates.

Additionally, or alternatively, the series of manufacturing operations includes forming a first integrated circuit die on a first semiconductor substrate. The series of manufacturing operations includes forming a second integrated circuit die on a second semiconductor substrate. The series of manufacturing operations includes forming a stack of semiconductor substrates by joining the first semiconductor substrate and the second semiconductor substrate. The series of manufacturing operations includes forming a supporting fill mixture including a sealant mixed with first composite particulates approximating a first shape and second composite particulates approximating a second shape in a lateral gap region between beveled edges of the stack of semiconductor substrates, where the second shape is other than the first shape. The series of manufacturing operations includes removing a stack of integrated circuit dies including the first integrated circuit die joined with the second integrated die from the stack of semiconductor substrates.

Additionally, or alternatively, the series of manufacturing operations includes joining two or more semiconductor substrates to form a stack including the two or more semiconductor substrates. The series of manufacturing operations includes forming a supporting fill mixture including first composite particulates and second composite particulates in a lateral gap region between beveled edges of the stack of two or more semiconductor substrates, where a first median of first range of sizes of the first composite particulates is greater relative to a second median of a second range of sizes of the second composite particulates. The series of manufacturing operations includes thinning a top semiconductor substrate of the stack of two or more semiconductor substrates.

The number and arrangement of semiconductor processing tools shown in FIG. 1 are provided as one or more examples. In practice, there may be additional semiconductor processing tools, different semiconductor processing tools, or differently arranged semiconductor processing tools than those shown in FIG. 1. Furthermore, two or more semiconductor processing tools shown in FIG. 1 may be implemented within a single tool set, or a tool set shown in FIG. 1 may be implemented as multiple, distributed semiconductor processing tools. Additionally, or alternatively, one or more semiconductor processing tools of environment 100 may perform one or more functions described as being performed by another tool set of environment 100.

Figure 2:
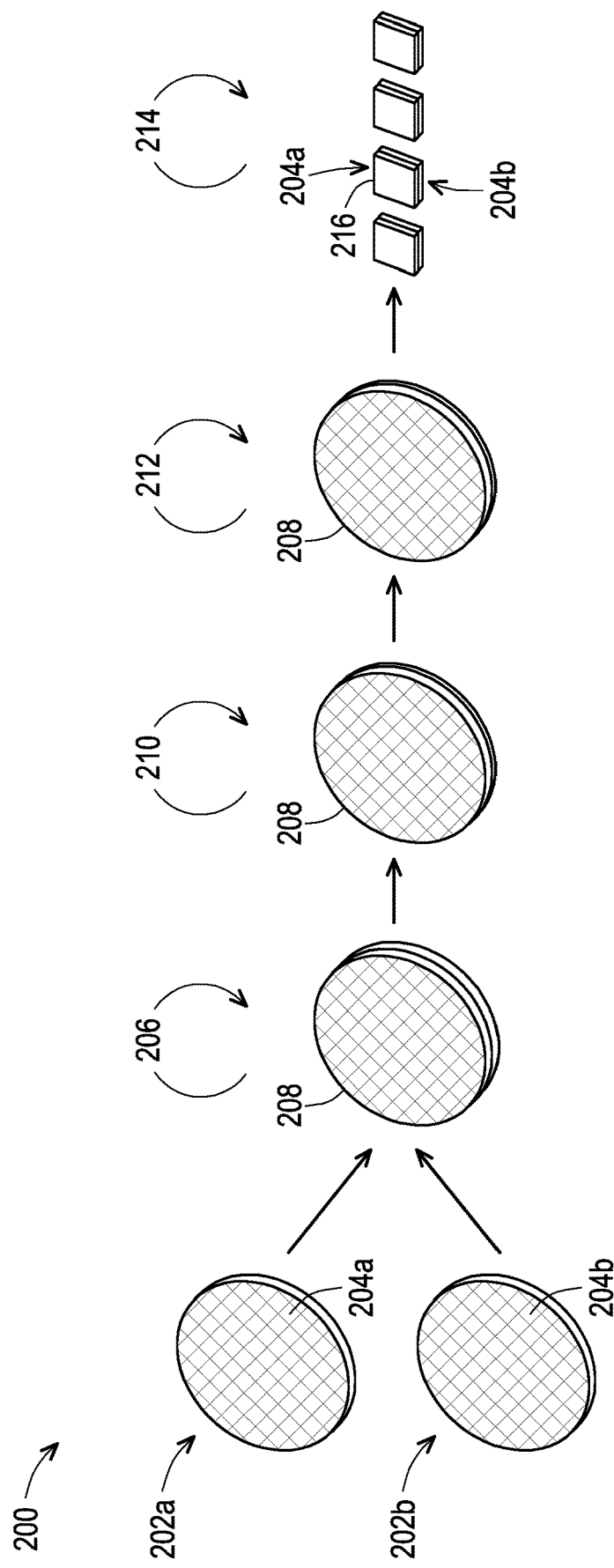
FIG. 2 is an example implementation of formation of a stacked integrated circuit die product described herein.

FIG. 2 is an example implementation 200 of formation of a stacked integrated circuit die product described herein. The implementation 200 may correspond a "Wafer-on-Wafer" (WoW) technique used to form a three-dimensional integrated circuit die (3DIC) product, among other examples. The example implementation 200 may use one or more semiconductor processing tools 102-118 of FIG. 1 to form the stacked integrated circuit die product.

As shown, a semiconductor substrate 202a may include an integrated circuit die 204a and a semiconductor substrate 202b may include an integrated circuit die 204b. The integrated circuit dies 204a and 204b may be formed using a series of deposition operations by the deposition tool 102, a series of patterning operations by the exposure tool 104, and a series of etch operations by the etch tool 106, among other examples.

A bonding operation 206 (e.g., a bonding operation by the bonding tool 108, among other examples) may align the integrated circuit dies 204a and 204b and bond the semiconductor substrates 202a and 202b to form a stack of semiconductor substrates 208. As a result of the bonding operation 206, integrated circuitry of the integrated circuit dies 204a and 204b may be electrically connected for signaling purposes (e.g., inputs/output signaling, clocking or timing signaling, and/or power signaling, among other examples). The bonding operation 206 may include a hybrid bonding operation, a eutectic bonding operation, a direct bonding operation, and/or another type of bonding operation.

To conserve space in a final semiconductor die package, a thinning operation 210 (e.g., a thinning operation by the planarization tool 112) may be performed to a top substrate of the stack of semiconductor substrates 208 (e.g., the semiconductor substrate 202a including the semiconductor die 204a). In some implementations, and as described in greater detail in connection with FIGS. 3A-8 and elsewhere herein, a supporting fill mixture is dispensed between beveled edges of the semiconductor substrate 202a and the semiconductor substrate 202b prior to the thinning operation 210. The supporting fill mixture may improve a robustness of the stack of semiconductor substrates 208 during the thinning operation 210 and/or subsequent operations performed to the stack of semiconductor substrates 208. For example, and by improving the robustness of the stack of semiconductor substrates, a likelihood of defects and/or yield loss within the stack of semiconductor substrates 208 due to trim-loss, trim wall exposure, and/or trim peeling that is inherent to a trimming operation may be reduced.

A bumping operation 212 (e.g., a bumping operation by the connection tool 114, among other examples) may form connection structures (e.g., solder balls, among other examples) on pads of integrated circuit dies of a top semiconductor substrate (e.g., the integrated circuit die 204a of the semiconductor substrate 202a). Such connection structures may be used for a testing operation and/or a packaging operation that encapsulates a stacked integrated circuit die product from the stack of semiconductor substrates 208.

A downstream series of operations 214 may include a testing operation and a dicing operation to test a stacked integrated circuit die product 216 (e.g., the integrated circuit die 204a joined to the integrated circuit die 204b) and extract the integrated die product 216 from the stack of semiconductor substrates. The testing operation (e.g., a testing operation by the ATE tool 116, among other examples) may ensure a quality of the bonding operation 210 and/or a quality of the integrated circuit dies included in the stack of semiconductor substrates 208 (e.g., the integrated circuit die 202a and/or the integrated circuit die 204b, among other examples). The testing operation may include a functionality test, a parametric test, and/or a reliability test, among other examples. The dicing operation to extract the stacked integrated circuit die product 216 from the stack of semiconductor substrates 208 may be performed by the singulation tool 118, among other examples.

As indicated above, FIG. 2 is provided as an example. Other examples may differ from what is described with regard to FIG. 2

Figure 3B:
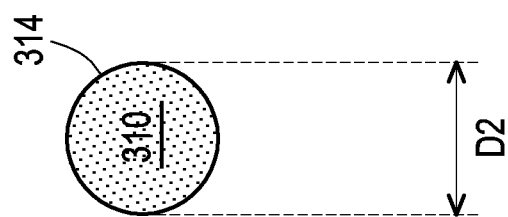
Figure 3B:
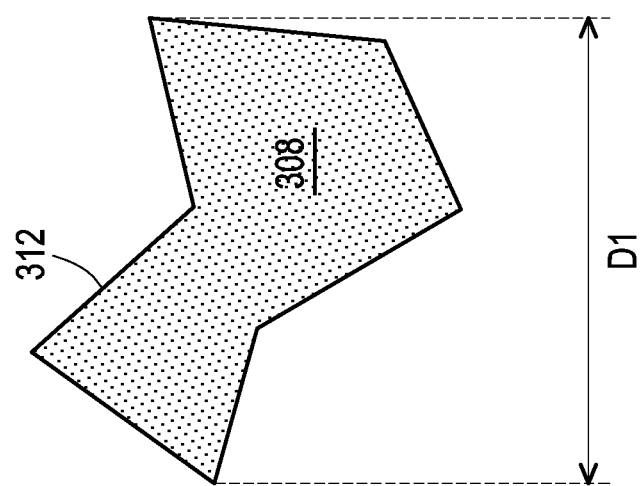
Figure 3C:
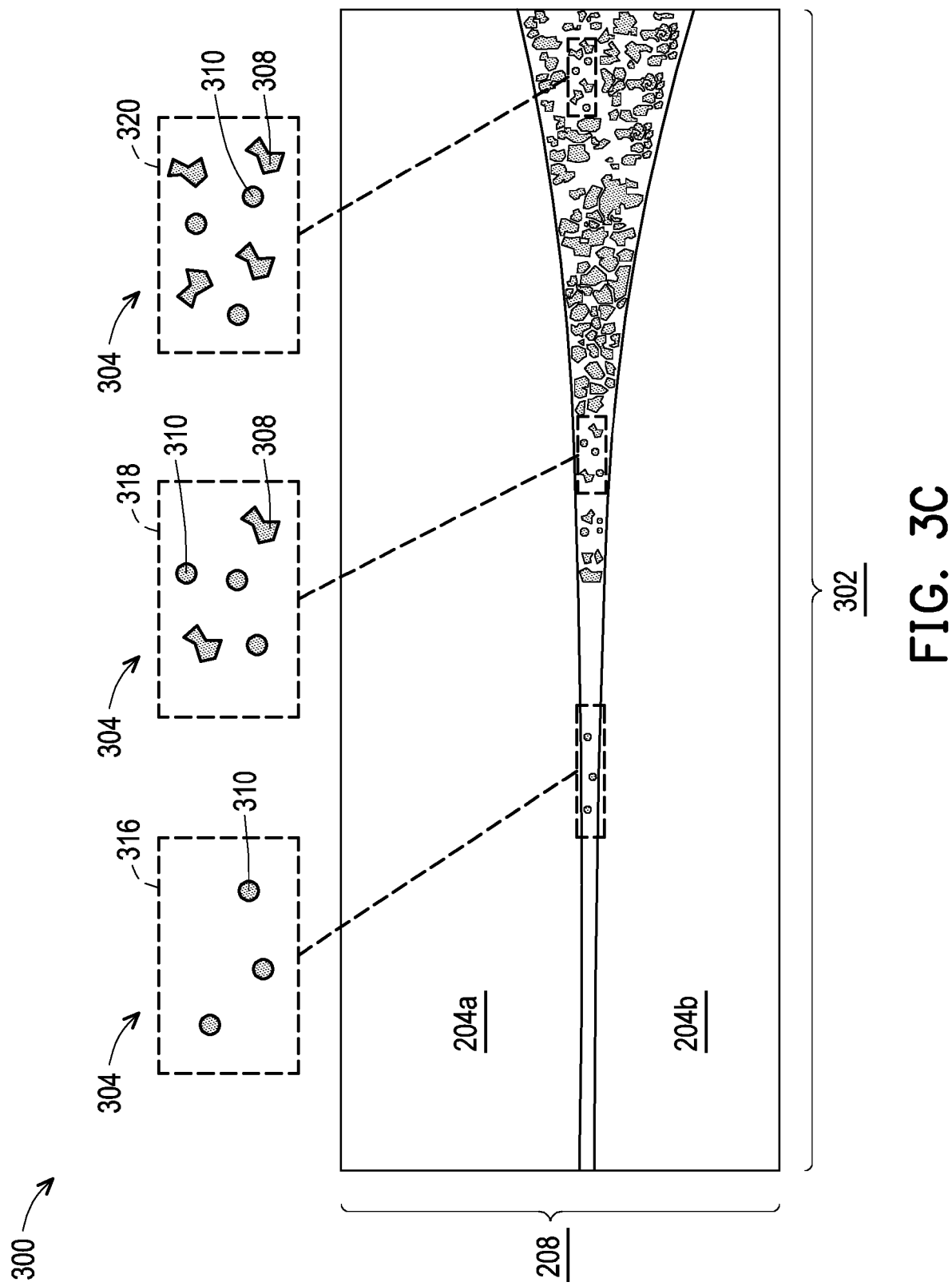

FIGS. 3A-3C are diagrams of an example implementation 300 of a supporting fill mixture including composite particulates described herein. As shown in FIG. 3A, the stack of semiconductor substrates 208 includes a lateral gap region 302 between the semiconductor substrate 204a and the semiconductor substrate 202b and near a perimeter region (e.g., circumference) of the stack of semiconductor substrates 208. Due to the presence of the lateral gap region 302, a multi-step manufacturing process (e.g., a process including a trimming operation, a grinding operation, and an amorphous silicon (a-Si) capping operation) is sometimes implemented to avoid damage to the stacked-wafer assembly during an operation that thins the stack of semiconductor substrates 208.

To avoid such a multi-step manufacturing process, a supporting fill mixture 304 is provided in the lateral gap region 302 to improve a robustness of the stack of semiconductor substrates 208. Such an improved robustness may reduce a likelihood of crack propagation within the semiconductor substrate 202a and/or the semiconductor substrate 202b during a thinning operation (e.g., the thinning operation 210 of FIG. 2, among other examples).

The supporting fill mixture 304 includes a sealant 306. The supporting fill mixture 304 further includes two or more composite particulates (e.g., composite particulates 308 and composite particulates 310, among other examples).

In some implementations, the sealant 306 includes a polyimide material, an epoxy material, or a polymer material, among other examples. In some implementations, the sealant 306 corresponds to a spin-on-dielectric material or a spin-on-glass material. Additionally, or alternatively, the sealant 306 may include a solvent gas. However, other materials included in the sealant 306 are within the scope of the present disclosure.

The composite particulates 308 may include a composite ceramic material. In such implementations, the composite particulates 308 may correspond to a zirconium tungsten phosphate ($Zr_2WP_2O_{12}$ or ZWP) composite material, among other examples. However, other materials included in the composite particulates 308 are within the scope of the present disclosure.

The composite particulates 310 may include a composite ceramic material. In such implementations, the composite particulates 310 may correspond to a silica material (e.g., silicon dioxide or $SiO_2$), among other examples. However, other materials included in the composite particulates 310 are within the scope of the present disclosure.

In some implementations, a mixture of the sealant 306, the composite particulates 308, and the composite particulates 310 alters an effective coefficient of thermal expansion (CTE) of the supporting fill mixture 304 to more-closely match the CTE of stack of semiconductor substrates 208 (e.g., the semiconductor substrate 202a and/or the semiconductor substrate 202b). Altering the effective CTE of the supporting fill mixture 304 to more-closely match the CTE of the stack of semiconductor substrates 208 may minimize strains to the supporting fill mixture 304 and/or the stack of semiconductor substrates 208 during a subsequent high temperature manufacturing operation (e.g., a far back end of line (BEOL) operation such as the bumping operation 212 of FIG. 2, an elevated temperature testing operation associated with the final series of operations 214 of FIG. 2, or an annealing operation, among other examples). Minimizing such strains may reduce a likelihood of tearing or damage to the supporting fill mixture 304 and/or damage to the stack of semiconductor substrates 208.

The supporting fill mixture 304 within different regions of the lateral gap region 302 may include amounts (e.g., concentrations) of the composite particulates 308 and the composite particulates 310. For example, in a case where the composite particulates 308 correspond to a ZWP material and the composite particulates correspond 310 to a silica material, the supporting fill mixture 304 within an outer region of the lateral gap region 302 may include the composite particulates 308 and the composite particulates 310. Further, and in the case where the composite particulates 308 correspond to a ZWP material and the composite particulates correspond 310 to a silica material, the supporting fill mixture 304 within an inner region of the lateral gap region 302 may include the composite particulates 310 while reducing an amount of (and/or excluding) the composite particulates 308.

FIG. 3B shows example details of the composite particulates 308 and 310. In some implementations, and as shown in FIG. 3B, the composite particulates 310 include a multi-surfaced shape including at least one surface having a serrated profile 312 (e.g., sharp edges). Additionally, or alternatively and as shown in FIG. 3B, the composite particulates 310 correspond to an approximately round shape having a smooth curvature 314. In addition to improvements that may be attained through the altered CTE as described above, the approximately round shape having the smooth curvature 314 may further reduce a likelihood of tearing or damage to a supporting fill mixture (e.g., the supporting fill mixture 304) and/or damage to a stack of semiconductor substrates (e.g., the stack of semiconductor substrates 208).

In some implementations, populations of the composite particulates 308 and 310 within a lateral gap region (e.g., the lateral gap region 302) may include respective gaussian distributions. In some implementations, a median of a range of sizes for the composite particulates 308 may be greater relative to a median of a range of sizes for the composite particulates 310. Such distributions and differences in sizes of the composite particulates 308 and 310 may enable greater concentrations of composite materials to be attained in a supporting fill mixture (e.g., the supporting fill mixture 304). Additionally, or alternatively, such distributions and differences in sizes of the composite particulates 308 and 310 may enable a "tuning" of a CTE of the supporting fill mixture to be more consistent throughout the lateral gap region.

As an example, a size D1 of the composite particulates 308 may be included in a range of approximately 0.7 microns to approximately 2.5 microns (e.g., corresponding to a median of approximately 1.6 microns). If the size D1 is less than approximately 0.7 microns, the composite particulates 308 (e.g., having the serrated profile 312) may penetrate to a depth within a lateral gap region (e.g., the lateral gap region 302) that increases a likelihood of tearing of the sealant 306. If the size is greater than approximately 2.5 microns, the composite particulates 308 may be too large to penetrate into the lateral gap region and not mix with a sealant (e.g., the sealant 306) to sufficiently alter a CTE of a supporting fill mixture (e.g., the supporting fill mixture 304) and reduce strains within the supporting fill mixture during a high temperature manufacturing operation. However, other values and ranges for the size D1 are within the scope of the present disclosure.

Additionally, or alternatively, a size D2 of the composite particulates 310 may be included in a range of approximately 0.4 microns to approximately 1.0 microns (e.g., corresponding to a median of approximately 0.7 microns). If the size D2 is less than approximately 0.4 microns, the composite particulates 310 may be too small to sufficiently alter a CTE of a supporting fill mixture (e.g., the supporting fill mixture 304) and reduce strains within the supporting fill mixture during a high temperature manufacturing operation. If the size D2 is greater than approximately 1.0 microns, the composite particulates 310 may not penetrate to a depth within a lateral gap region (e.g., the lateral gap region 302) to maintain a robustness of the supporting fill mixture 304 and/or the stacked semiconductor substrates. However, other values and ranges for the size D2 are within the scope of the present disclosure.

FIG. 3C shows additional details of implementation 300 including example, relative concentrations of the composite particulates 308 and 310 within the lateral gap region 302. In some implementations, a ratio of a concentration (e.g., parts per million, or ppm) of the composite particulates 308 to a concentration of the composite particulates 310 may change relative to a lateral position within the lateral gap region 302.

For example, and as shown within an inner region 316 of the lateral gap region 302, a concentration of the composite particulates 310 is greater relative to a concentration of the composite particulates 308. Additionally, or alternatively and as shown, a concentration of the composite particulates 308 within a middle region 318 is increased relative to the concentration of the composite particulates 308 within the inner region 316. Additionally, or alternatively and as shown, a concentration of the composite particulates 310 within the middle region 318 is the approximately the same and/or less relative to the concentration of the composite particulates 310 within the inner region 316. As such, a ratio of the concentration of the composite particulates 308 to the concentration of the composite particulates 310 changes relative to a lateral position (e.g., the inner region 316 and the middle region 318) within the lateral gap region 302.

Additionally, or alternatively and as shown within an outer region 320 of the lateral gap region 302, a concentration of the composite particulates 308 is greater relative to a concentration of the composite particulates 308 within the middle region 318. Additionally, or alternatively and as shown, a concentration of the composite particulates 310 within the outer region 320 is the approximately the same and/or less relative to the concentration of the composite particulates 310 within middle region 318. As such, a ratio of the concentration of the composite particulates 308 to the concentration of the composite particulates 310 changes relative to a lateral position (e.g., the middle region 318 and the outer region 320 within the lateral gap region 302.

The distribution of the composite particulates 308 and 310 throughout the lateral gap region 302 results, in part, from the shapes and/or distribution of sizes of the composite particulates 308 and 310. In particular, the smoother shape and smaller size of the composite particulate 310 relative to the composite particulate 310 enables the composite particulate 310 to penetrate more deeply into the lateral gap region 302. Accordingly, a concentration of the composite particulates 310 relative the composite particulate 308 may increase as a function of depth in the lateral gap region 302.

Additionally, or alternatively, one or more physical properties of the supporting fill mixture 304 may vary based on amounts of the particulates 308 and 310 within regions of the lateral gap region 302. For example, and for first a region including a first percentage of the particulates 310 (e.g., the inner region 316 and/or the middle region 318, among other examples), a first set of physical properties may include a viscosity that is included in a range of approximately 7 Pascal Seconds (Pa·s) to approximately 9 Pa·s, a glass transition temperature (T g) that is included in a range of approximately 400 degrees Celsius (° C.) to approximately 420° C., a coefficient of thermal expansion (CTE) that is included in a range of approximately 14 parts per million per degree Kelvin (ppm/K) to approximately 18 ppm/K, and/or a modulus of elasticity that is included in a range of approximately 7 Gigapascals (Gpa) to approximately 9 GPA. Additionally, or alternatively and for a second region including a second percentage of the particulates 310 that is lesser relative to the first percentage (e.g., the outer region 320), a second set of physical properties may include a viscosity that is included in a range of approximately 4 Pa·s to approximately 9 Pa s, a glass transition temperature ($T_g$) that is included in a range of approximately 420° C. to approximately 440° C., a coefficient of thermal expansion (CTE) that is included in a range of approximately 14 ppm/K to approximately 18 ppm/K, and/or a modulus of elasticity that is included greater than approximately 10 Gigapascals (Gpa) to approximately 14 GPA. However, other values and ranges for the first set of physical properties and the second set of physical properties are within the scope of the present disclosure.

In some implementations, a modulus of elasticity of the supporting fill mixture 304 within the first region (e.g., the inner region 316 and/or the middle region 318, among other examples) is lesser relative to a modulus of elasticity of the supporting fill mixture 304 within the second region (e.g., the outer region 320). In such a case, stresses and/or displacements within the first region may be lesser relative to stresses and/or displacements within the second region.

Such lesser strains and/or displacements may reduce a likelihood of tearing within the supporting fill mixture 304 in the event composite particulates 308 (e.g., the composite particulates 308 including the serrated profile 312) are within the first region.

As indicated above, FIGS. 3A-3C are provide as examples. Other examples may differ from what is described with regard to FIGS. 3A-3C.

FIGS. 4A-4D are example manufacturing operations 400 that include a use of the supporting fill mixture 304 including the composite particulates 308 and 310 describe herein. The manufacturing operations 400 may use one or more of the semiconductor processing tools 102-118 described in connection with FIG. 1.

Figure 4A:
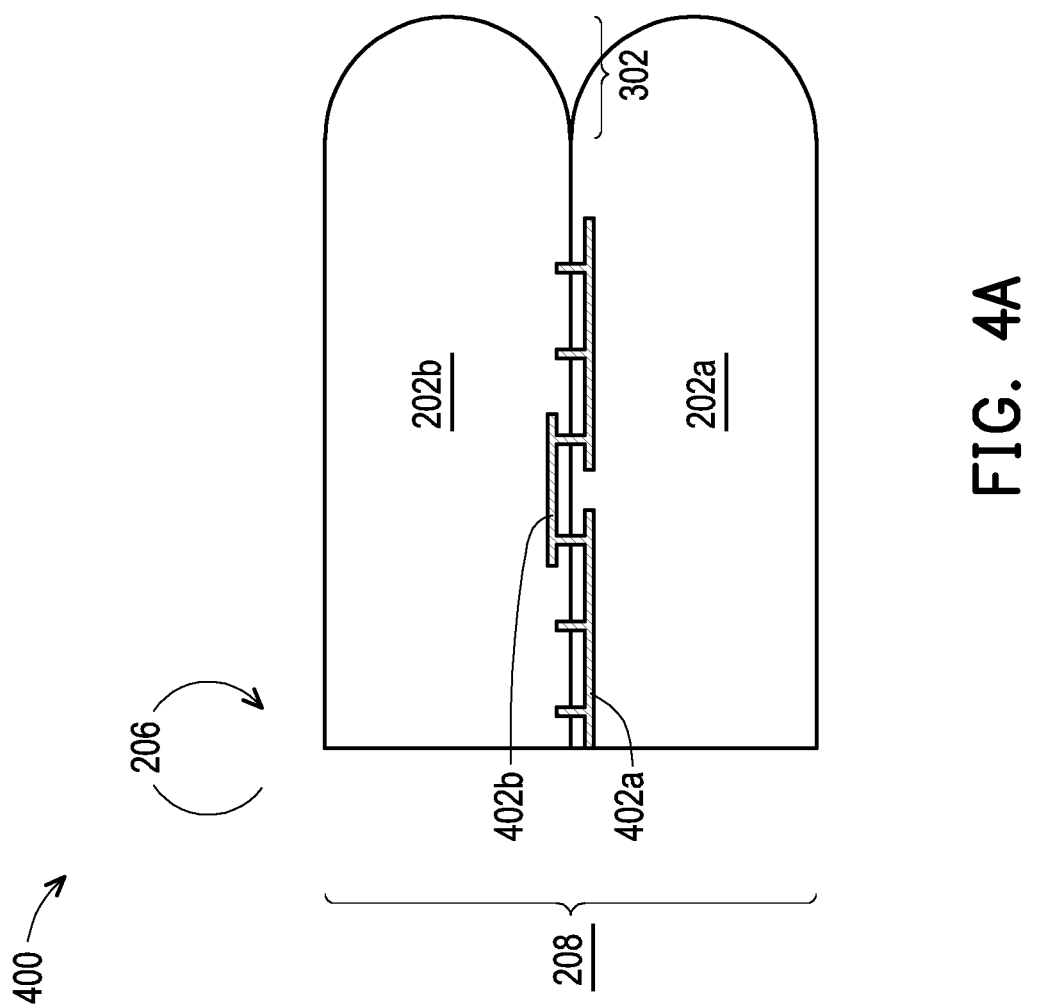
FIGS. 4A-4D are diagrams of example manufacturing operations that include a use of the supporting fill mixture including the composite particulates describe herein.

As shown in FIG. 4A, a bonding tool (e.g., the bonding tool 108) may perform the bonding operation 206 of FIG. 2 to join the semiconductor substrate 202a and the semiconductor substrate 202b. The semiconductor substrate 202a may include integrated circuitry 402a (e.g., metallization layers, transistors, memory cells, and/or logic gates formed on the semiconductor substrate 202a by the deposition tool 102, the exposure tool 104, and/or the etch tool 106, among other examples) of an integrated circuit die (e.g., the integrated circuit die 204a). The semiconductor substrate 202b may include integrated circuitry 402b (e.g., metallization layers, transistors, memory cells, and/or logic gates formed on the semiconductor substrate 202b by the deposition tool 102, the exposure tool 104, and/or the etch tool 106, among other examples) of an integrated circuit die (e.g., the integrated circuit die 204b). The bonding operation 206 may connect the integrated circuitry 402a and the integrated circuitry 402b. As part of the bonding operation 404, the lateral gap region 302 manifests between beveled edges of the semiconductor substrate 202a and the semiconductor substrate 202b.

Figure 4B:
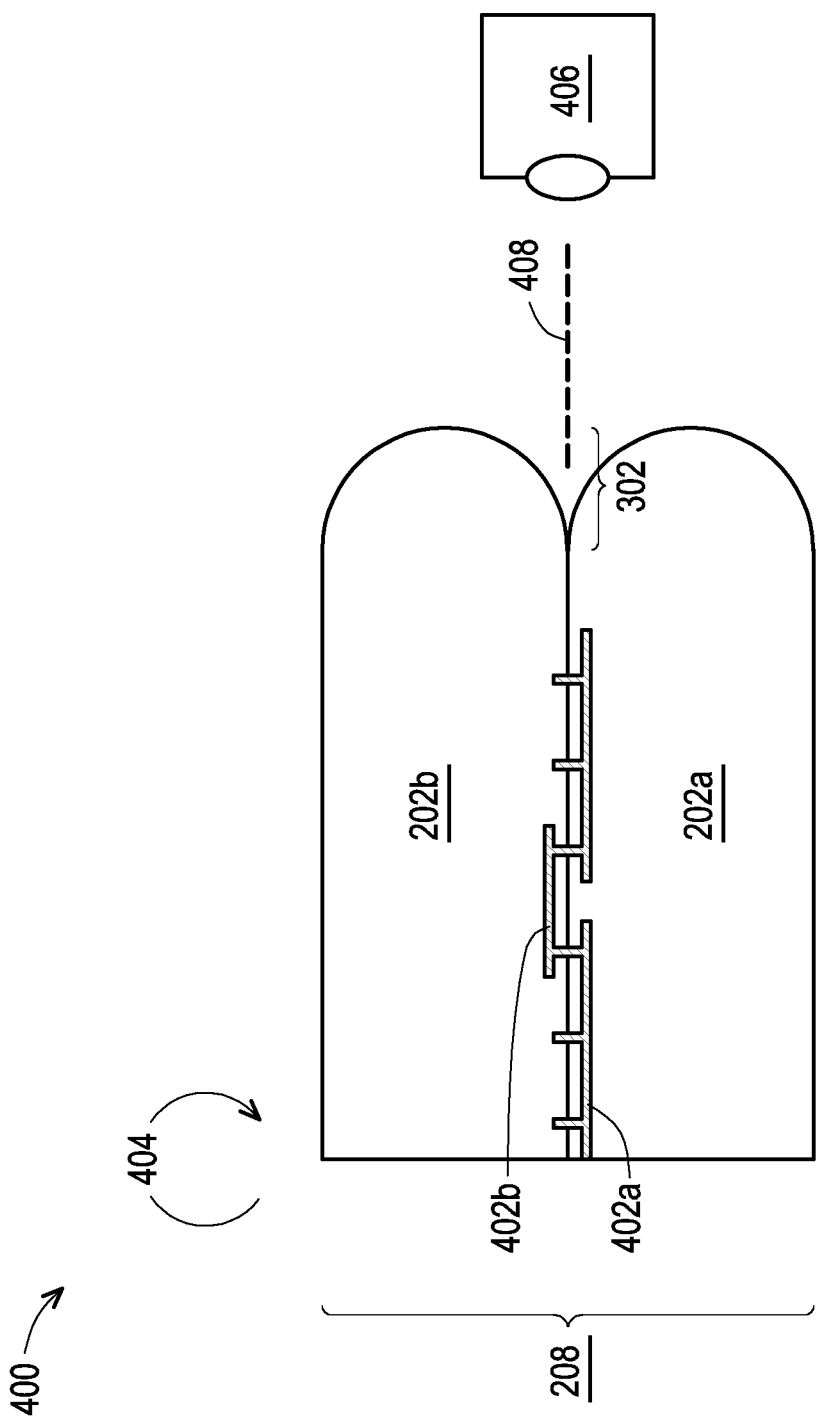

In some implementations, and as shown in FIG. 4B, and an inspection tool 406 (e.g., an image sensor coupled to a microprocessor, among other examples) inspects the lateral gap region 302. The inspection tool 406 may inspect the lateral gap region 302 to identify an approximate center 408 of the lateral gap region 302. In some implementations, the inspection tool 406 may be included in a deposition tool (e.g., the deposition tool 102).

Figure 4C:
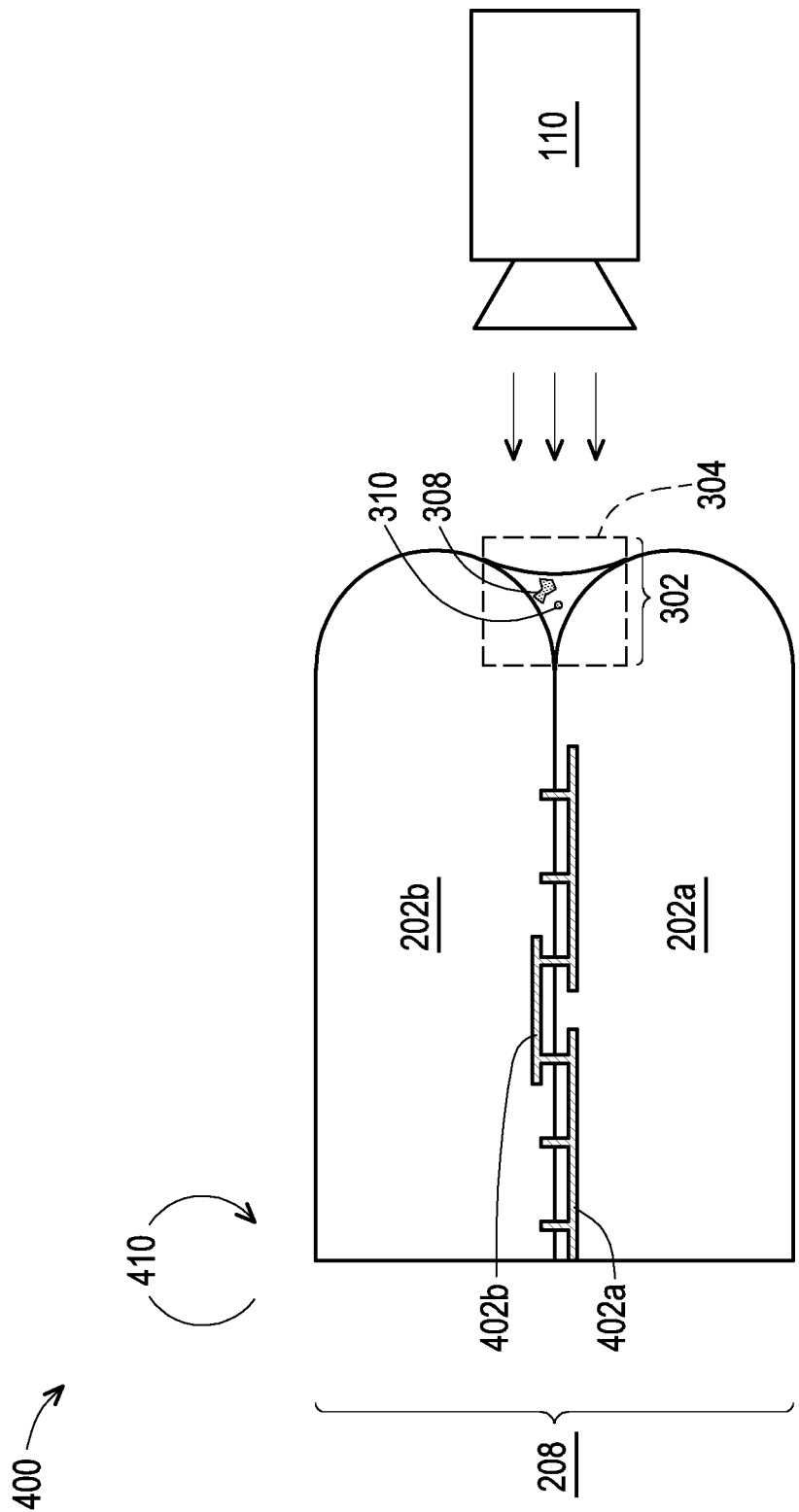

As shown in FIG. 4C, and as part of a deposition operation 410, the deposition tool 102 forms the supporting fill mixture 304 in in the lateral gap region 302 between the beveled edges of the semiconductor substrates 202a and 202b. In some implementations, the deposition tool 102 includes a jet nozzle.

In some implementations, the deposition operation 410 corresponds to a single deposition operation. In such implementations, the deposition operation 410 forms an entire volume of the supporting fill mixture 304.

In some implementations, the deposition operation 410 corresponds to a dual-deposition operation that uses a first deposition operation to form a first percentage volume of the supporting fill mixture 304 and uses a second deposition operation to form a second percentage volume of the supporting fill mixture 304. In such implementations, the first deposition operation may deposit a sealant material mixed with the composite particulates 308, and the second deposition operation may deposit another sealant material mixed with the composite particulates 310.

Figure 4D:
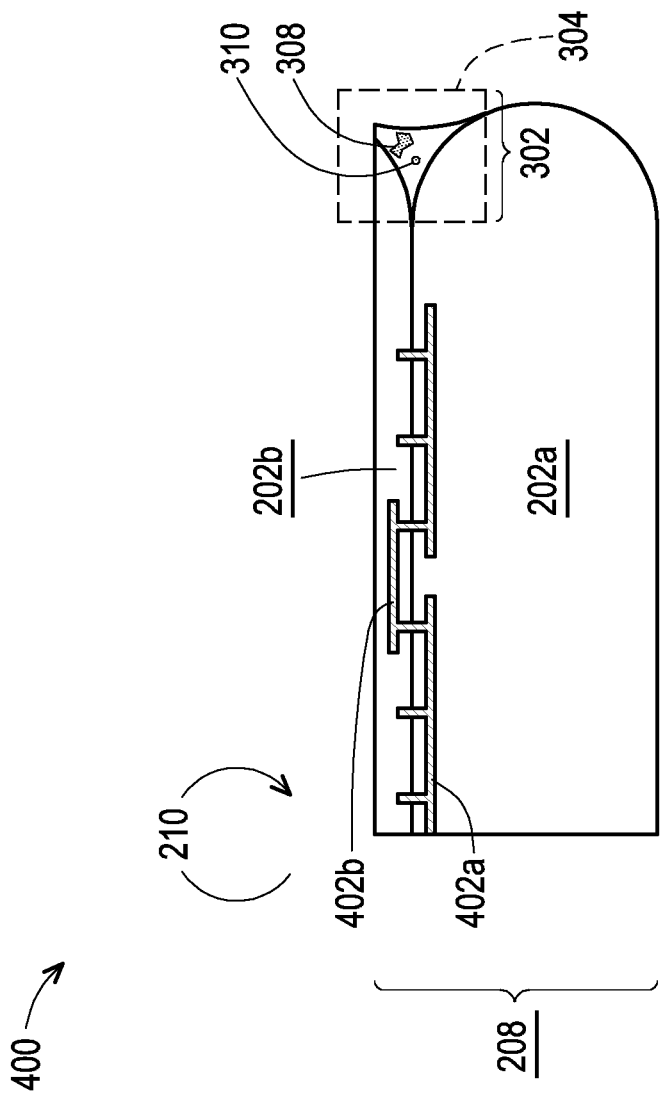

As shown in FIG. 4D, a planarization tool (e.g., the planarization tool 112, among other examples) performs the thinning operation 210 of FIG. 2 to thin (e.g., reduce a thickness) of the semiconductor substrate 202b. Subsequent to the thinning operation 210, the stack of semiconductor substrates 208 may be subject to additional operations (e.g., the bumping operation 212 and the downstream series of operations 214 of FIG. 2, among other examples). In some implementations, the additional operations (e.g., the dicing operation of the downstream series of operations 214, among other examples) may remove perimeter edges of the stack of semiconductor substrates 208, including the supporting fill mixture 304.

As indicated above, FIGS. 4A-4D are provided as examples. Other examples may differ from what is described with regard to FIGS. 4A-4D. Furthermore, although FIGS. 4A-4D show example operations of the manufacturing operations 400, in some implementations, the manufacturing operations 400 includes additional operations, fewer operations, different operations, or differently arranged operations than those shown in FIGS. 4A-4D.

Figure 5:
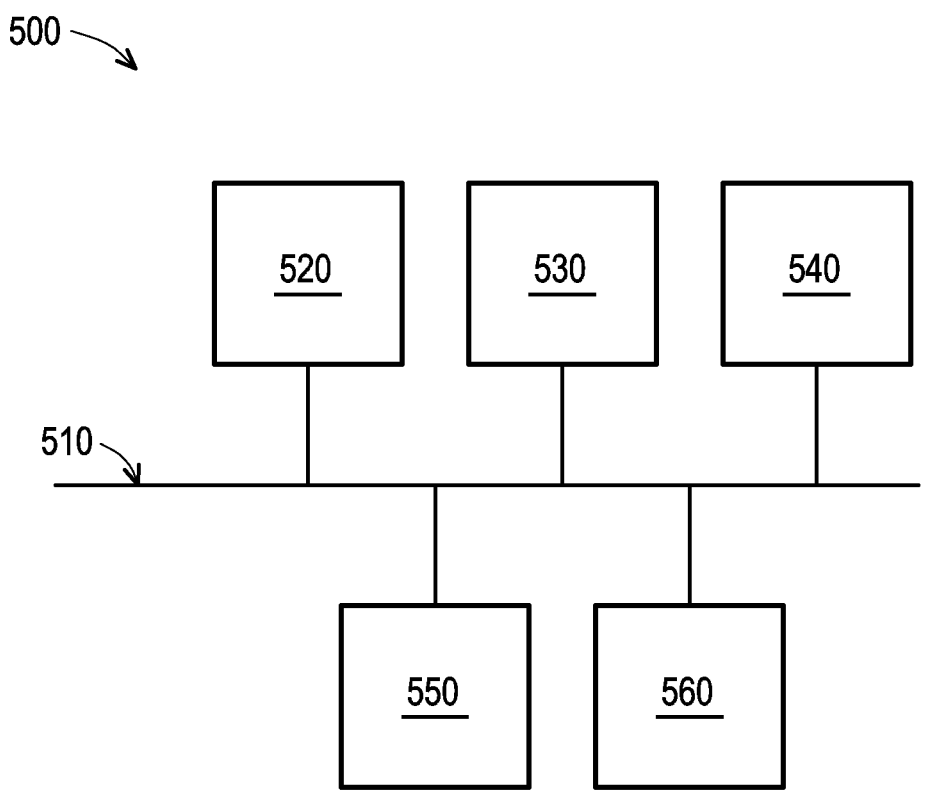
FIG. 5 is a diagram of example components of one or more devices of FIG. 1 described herein.

FIG. 5 is a diagram of example components of one or more devices 500 of FIG. 1 described herein. The device 500 may correspond to one or more of the semiconductor processing tools 102-118. In some implementations, one or more of the semiconductor processing tools 102-118. may include one or more devices 500 and/or one or more components of the device 500. As shown in FIG. 5, the device 500 may include a bus 510, a processor 520, a memory 530, an input component 540, an output component 550, and/or a communication component 560.

The bus 510 may include one or more components that enable wired and/or wireless communication among the components of the device 500. The bus 510 may couple together two or more components of FIG. 5, such as via operative coupling, communicative coupling, electronic coupling, and/or electric coupling. For example, the bus 510 may include an electrical connection (e.g., a wire, a trace, and/or a lead) and/or a wireless bus. The processor 520 may include a central processing unit, a graphics processing unit, a microprocessor, a controller, a microcontroller, a digital signal processor, a field-programmable gate array, an application-specific integrated circuit, and/or another type of processing component. The processor 520 may be implemented in hardware, firmware, or a combination of hardware and software. In some implementations, the processor 520 may include one or more processors capable of being programmed to perform one or more operations or processes described elsewhere herein.

The memory 530 may include volatile and/or nonvolatile memory. For example, the memory 530 may include random access memory (RAM), read only memory (ROM), a hard disk drive, and/or another type of memory (e.g., a flash memory, a magnetic memory, and/or an optical memory). The memory 530 may include internal memory (e.g., RAM, ROM, or a hard disk drive) and/or removable memory (e.g., removable via a universal serial bus connection). The memory 530 may be a non-transitory computer-readable medium. The memory 530 may store information, one or more instructions, and/or software (e.g., one or more software applications) related to the operation of the device 500. In some implementations, the memory 530 may include one or more memories that are coupled (e.g., communicatively coupled) to one or more processors (e.g., processor 520), such as via the bus 510. Communicative coupling between a processor 520 and a memory 530 may enable the processor 520 to read and/or process information stored in the memory 530 and/or to store information in the memory 530.

The input component 540 may enable the device 500 to receive input, such as user input and/or sensed input. For example, the input component 540 may include a touch screen, a keyboard, a keypad, a mouse, a button, a microphone, a switch, a sensor, a global positioning system sensor, an accelerometer, a gyroscope, and/or an actuator. The output component 550 may enable the device 500 to provide output, such as via a display, a speaker, and/or a light-emitting diode. The communication component 560 may enable the device 500 to communicate with other devices via a wired connection and/or a wireless connection. For example, the communication component 560 may include a receiver, a transmitter, a transceiver, a modem, a network interface card, and/or an antenna.

The device 500 may perform one or more operations or processes described herein. For example, a non-transitory computer-readable medium (e.g., memory 530) may store a set of instructions (e.g., one or more instructions or code) for execution by the processor 520. The processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, the processor 520 may be configured to perform one or more operations or processes described herein. Thus, implementations described herein are not limited to any specific combination of hardware circuitry and software.

The number and arrangement of components shown in FIG. 5 are provided as an example. The device 500 may include additional components, fewer components, different components, or differently arranged components than those shown in FIG. 5. Additionally, or alternatively, a set of components (e.g., one or more components) of the device 500 may perform one or more functions described as being performed by another set of components of the device 500.

Figure 6:
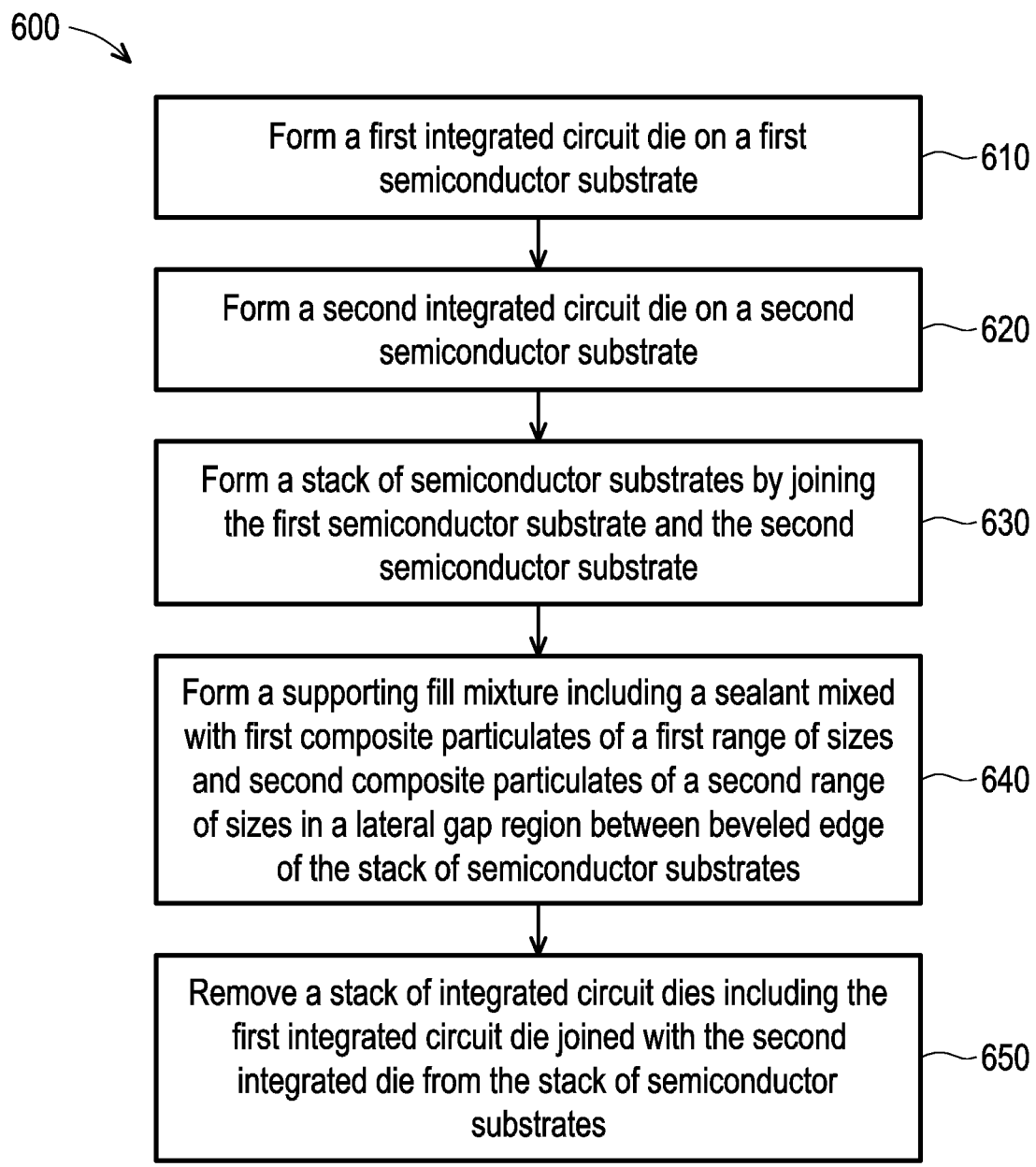
FIGS. 6-8 are flowcharts of an example processes associated with using a supporting fill mixture including the composite particulates described herein.

FIG. 6 is a flowchart of an example process 600 associated with using the supporting fill mixture 304 including the composite particulates 308 and 310 described herein. In some implementations, one or more process blocks of FIG. 6 are performed by a one or more of the semiconductor processing tool tools 102-118. Additionally, or alternatively, one or more process blocks of FIG. 6 may be performed by one or more components of device 500, such as processor 520, memory 530, input component 540, output component 550, and/or communication component 560.

As shown in FIG. 6, process 600 may include forming a first integrated circuit die on a first semiconductor substrate (block 610). For example, one or more of the semiconductor processing tool tools 102-118, such as such as the deposition tool 102, the exposure tool 104, and/or the etch tool 106, among other examples, may form a first integrated circuit die (e.g., the integrated circuit die 204*a*) on a first semiconductor substrate (e.g., the semiconductor substrate 202*a*), as described above.

As further shown in FIG. 6, process 600 may include forming a second integrated circuit die on a second semiconductor substrate (block 620). For example, one or more of the semiconductor processing tool tools 102-118, such as such as the deposition tool 102, the exposure tool 104, and/or the etch tool 106, among other examples, may form a second integrated circuit die (e.g., the integrated circuit die 204*b*) on a second semiconductor substrate (e.g., the semiconductor substrate 202*b*), as described above.

As further shown in FIG. 6, process 600 may include forming a stack of semiconductor substrates by joining the first semiconductor substrate and the second semiconductor substrate (block 630). For example, one or more of the semiconductor processing tool tools 102-118, such as the bonding tool 108, among other examples, may form a stack of semiconductor substrates 208 by joining the first semiconductor substrate and the second semiconductor substrate, as described above.

As further shown in FIG. 6, process 600 may include forming a supporting fill mixture including a sealant mixed with first composite particulates of a first range of sizes and second composite particulates of a second range of sizes in a lateral gap region between beveled edges of the stack of semiconductor substrates (block 640). For example, one or more of the semiconductor processing tool tools 102-118, such as the dispense tool 110, among other examples, may form a supporting fill mixture 304 including a sealant 306 mixed with first composite particulates (e.g., the composite particulates 310) of a first range of sizes and second composite particulates (e.g., the composite particulates 308) of a second range of sizes in a lateral gap region 302 between beveled edges of the stack of semiconductor substrates 208, as described above. In some implementations, a first median of the first range of sizes (e.g., D1) is greater relative to a second median of the second range of sizes (e.g., D2).

As further shown in FIG. 6, process 600 may include removing a stack of integrated circuit dies including the first integrated circuit die joined with the second integrated die from the stack of semiconductor substrates (block 650). For example, one or more of the semiconductor processing tool tools 102-118, such as the singulation tool 118, among other examples, may remove a stack of integrated circuit dies (e.g., the stack of integrated circuit die product 216) including the first integrated circuit die (e.g., the integrated circuit die 204*a*) joined with the second integrated die (e.g., the integrated circuit die 204*a*) from the stack of semiconductor substrates 208, as described above.

Process 600 may include additional implementations, such as any single implementation or any combination of implementations described below and/or in connection with one or more other processes described elsewhere herein.

In a first implementation, the first range of sizes corresponds to a range of approximately 0.7 microns to approximately 2.5 microns.

In a second implementation, alone or in combination with the first implementation, the second range of sizes corresponds to a range of approximately 0.4 microns to approximately 1.0 microns.

In a third implementation, alone or in combination with one or more of the first and second implementations, the sealant corresponds to a spin-on-dielectric material or a spin-on-glass material.

In a fourth implementation, alone or in combination with one or more of the first through third implementations, the sealant includes a polyimide material, an epoxy material, or a polymer material.

In a fifth implementation, alone or in combination with one or more of the first through fourth implementations, the first composite particulates include a ceramic composite material.

In a sixth implementation, alone or in combination with one or more of the first through fifth implementations, the first composite particulates include a zirconium tungsten phosphate composite material.

In a seventh implementation, alone or in combination with one or more of the first through sixth implementations, the second composite particulates include silica particulates.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Figure 7:
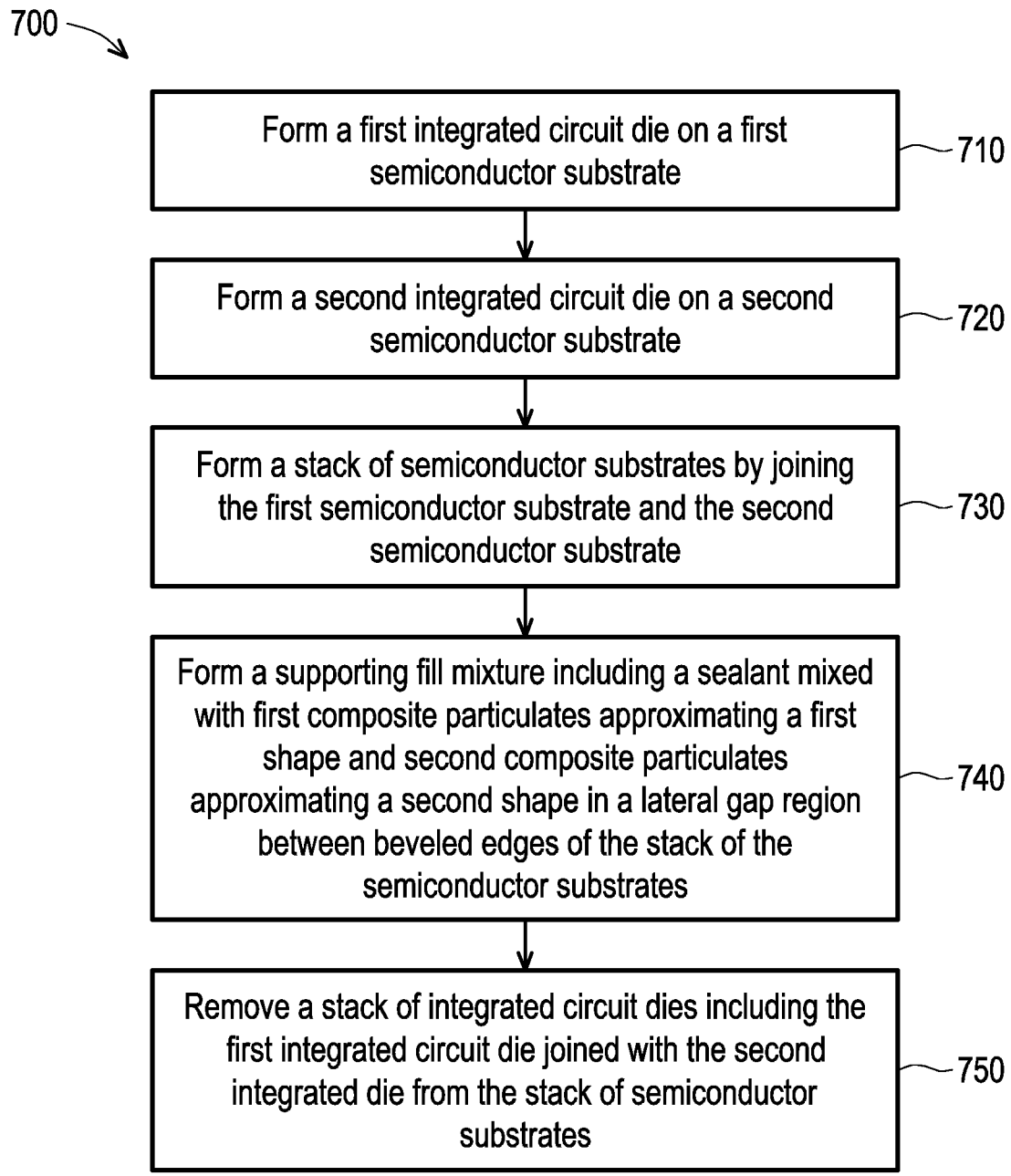

FIG. 7 is a flowchart of an example process 700 associated with using the supporting fill mixture 304 including the composite particulates 308 and 310 described herein. In some implementations, one or more process blocks of FIG. 7 are performed by a one or more of the semiconductor processing tool tools 102-118. Additionally, or alternatively, one or more process blocks of FIG. 7 may be performed by one or more components of device 500, such as processor 520, memory 530, input component 540, output component 550, and/or communication component 560.

As shown in FIG. 7, process 700 may include forming a first integrated circuit die on a first semiconductor substrate (block 710). For example, one or more of the semiconductor processing tool tools 102-118, such as such as the deposition tool 102, the exposure tool 104, and/or the etch tool 106, among other examples, may form a first integrated circuit die (e.g., the integrated circuit die 204a) on a first semiconductor substrate (e.g., the semiconductor substrate 202a), as described above.

As further shown in FIG. 7, process 700 may include forming a second integrated circuit die on a second semiconductor substrate (block 720). For example, one or more of the semiconductor processing tool tools 102-118, such as such as the deposition tool 102, the exposure tool 104, and/or the etch tool 106, among other examples, may form a second integrated circuit die (e.g., the integrated circuit die 204b) on a second semiconductor substrate (e.g., the semiconductor substrate 202b), as described above.

As further shown in FIG. 7, process 700 may include forming a stack of semiconductor substrates by joining the first semiconductor substrate and the second semiconductor substrate (block 730). For example, one or more of the semiconductor processing tool tools 102-118, such as the bonding tool 108, among other examples, may form a stack of semiconductor substrates 208 by joining the first semiconductor substrate (e.g., the semiconductor substrate 202a) and the second semiconductor substrate (e.g., the semiconductor substrate 202b), as described above.

As further shown in FIG. 7, process 700 may include forming a supporting fill mixture including a sealant mixed with first composite particulates approximating a first shape and second composite particulates approximating a second shape in a lateral gap region between beveled edges of the stack of semiconductor substrates (block 740). For example, one or more of the semiconductor processing tool tools 102-118, such as the dispense tool 110, among other examples, may form a supporting fill mixture 304 including a sealant 306 mixed with first composite particulates (e.g., the composite particulates 308) approximating a first shape and second composite particulates (e.g., the composite particulates 310) approximating a second shape in a lateral gap region 302 between beveled edges of the stack of semiconductor substrates 208, as described above. In some implementations, the second shape is other than the first shape.

As further shown in FIG. 7, process 700 may include removing a stack of integrated circuit dies including the first integrated circuit die joined with the second integrated die from the stack of semiconductor substrates (block 750). For example, one or more of the semiconductor processing tool tools 102-118, such as the singulation tool 118, among other examples, may remove a stack of integrated circuit dies (e.g., the stack of integrated circuit die product 216) including the first integrated circuit die (e.g., the integrated circuit die 204a) joined with the second integrated die (e.g., the integrated circuit die 204a) from the stack of semiconductor substrates 208, as described above.

Process 700 may include additional implementations, such as any single implementation or any combination of implementations described below and/or in connection with one or more other processes described elsewhere herein.

In a first implementation, the first shape corresponds to an approximately round shape having a smooth curvature 314.

In a second implementation, alone or in combination with the first implementation, the second shape corresponds to a multi-surfaced shape including at least one surface having a serrated profile 312.

In a third implementation, alone or in combination with one or more of the first and second implementations, a ratio of a first concentration of the first composite particulates to a second concentration of the second composite particulates changes relative to a lateral position within the gap region.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
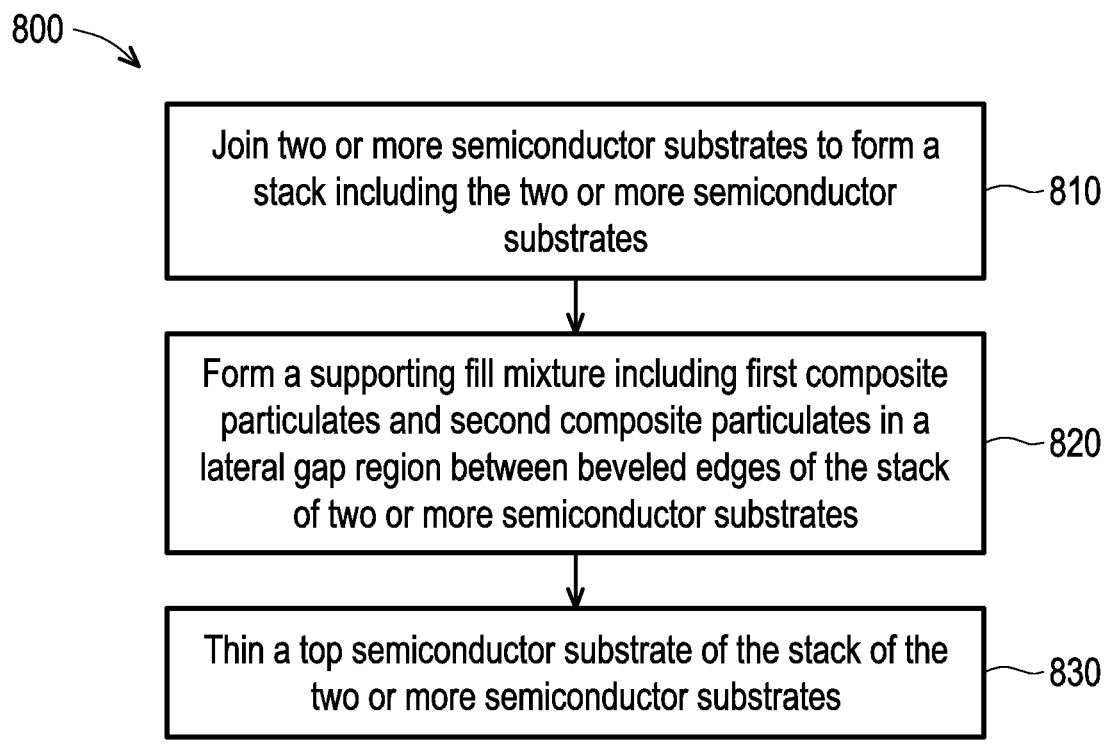

FIG. 8 is a flowchart of an example process 800 associated with using the supporting fill mixture 304 including the composite particulates 308 and 310 described herein. In some implementations, one or more process blocks of FIG. 8 are performed by a one or more of the semiconductor processing tool tools 102-118. Additionally, or alternatively, one or more process blocks of FIG. 8 may be performed by one or more components of device 500, such as processor 520, memory 530, input component 540, output component 550, and/or communication component 560.

As shown in FIG. 8, process 800 may include joining two or more semiconductor substrates to form a stack including the two or more semiconductor substrates (block 810). For example, one or more of the semiconductor processing tool tools 102-118, such as the bonding tool 108, may join two or more semiconductor substrates (e.g., the semiconductor substrate 202a and the semiconductor substrate 202b, among other examples) to form a stack including the two or more semiconductor substrates (e.g., the stack of semiconductor substrates 208), as described above.

As further shown in FIG. 8, process 800 may include forming a supporting fill mixture including first composite particulates and second composite particulates in a lateral gap region between beveled edges of the stack of two or more semiconductor substrates (block 820). For example, one or more of the semiconductor processing tool tools 102-118, such as the dispense tool 110, may form a supporting fill mixture 304 including first composite particulates (e.g., the composite particulates 308) and second composite particulates (e.g., the composite particulates) in a lateral gap region 302 between beveled edges of the stack of two or more semiconductor substrates, as described above. In some implementations, a first median of first range of sizes (e.g., D1) of the first composite particulates is greater relative to a second median of a second range of sizes (e.g., D2) of the second composite particulates.

As further shown in FIG. 8, process 800 may include thinning a top semiconductor substrate of the stack of two or more semiconductor substrates (block 830). For example, one or more of the semiconductor processing tool tools 102-118, such as the planarization tool 112, may thin a top semiconductor substrate (e.g., the semiconductor substrate 202*b*) of the stack of two or more semiconductor substrates, as described above.

Process 800 may include additional implementations, such as any single implementation or any combination of implementations described below and/or in connection with one or more other processes described elsewhere herein.

In a first implementation, process 800 includes scanning the lateral gap region 302 to determine an approximate center 408 of the lateral gap region 302 prior to forming the supporting fill mixture 304 in the lateral gap region 302.

In a second implementation, alone or in combination with the first implementation, forming the supporting fill mixture 304 includes forming the supporting fill mixture 304 using a jet nozzle to deposit the supporting fill mixture 304.

In a third implementation, alone or in combination with one or more of the first and second implementations, forming the supporting fill mixture 304 includes forming the supporting fill mixture 304 to include a first concentration of the first composite particulates (e.g., the composite particulates 308) within an inner region 316 of the lateral gap region 302, and forming the supporting fill mixture 304 to include a second concentration of the second composite particulates (e.g., the composite particulates 310) within the inner region 316 of the lateral gap region 302, where the second concentration is greater relative to the first concentration.

In a fourth implementation, alone or in combination with one or more of the first through third implementations, forming the supporting fill mixture 304 includes forming the supporting fill mixture 304 using a single deposition operation.

In a fifth implementation, alone or in combination with one or more of the first through fourth implementations, forming the supporting fill mixture 304 includes using a first deposition operation to form a first percentage volume of the supporting fill mixture 304, and using a second deposition operation to form a second percentage volume of the supporting fill mixture 304.

In a sixth implementation, alone or in combination with one or more of the first through fifth implementations, the using the first deposition operation to form the first percentage volume of the supporting fill mixture 304 includes using the first deposition operation to deposit a first sealant mixed with the first composite particulates (e.g., the composite particulates 308), and where using the second deposition operation to form the second percentage of volume of the supporting fill mixture 304 includes using the second deposition operation to deposit a second sealant mixed with the second composite particulates (e.g., the composite particulates 310).

In a seventh implementation, alone or in combination with one or more of the first through sixth implementations, the first sealant and the second sealant include a same material.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein include systems and techniques for fabricating a stacked die product. The systems and techniques include using a supporting fill mixture that includes a combination of types of composite particulates in a lateral gap region of a stack of semiconductor substrates and along a perimeter region of the stack of semiconductor substrates. One type of composite particulate included in the combination may be a relatively smaller size and include a smooth surface, allowing the composite particulate to ingress deep into the lateral gap region. Properties of the supporting fill mixture including the combination of types of composite particulates may control thermally induced stresses during downstream manufacturing to reduce a likelihood of defects in the supporting fill mixture and/or the stack of semiconductor substrates.

In this way, the combination of types of composite particulates enables the supporting fill mixture and the stack of semiconductor substrates to incur fewer defects relative to another stack of semiconductor substrates that is formed using techniques that do not include using the combination of types of composite particulates. As such, a reduction in resources allocated to manufacturing a volume of the stacked die product may be reduced (e.g., a reduction in semiconductor manufacturing tools, a reduction in supporting computing resources, and/or a reduction in materials, among other examples).

As described in greater detail above, some implementations described herein provide a method. The method includes forming a first integrated circuit die on a first semiconductor substrate. The method includes forming a second integrated circuit die on a second semiconductor substrate. The method includes forming a stack of semiconductor substrates by joining the first semiconductor substrate and the second semiconductor substrate. The method includes forming a supporting fill mixture including a sealant mixed with first composite particulates of a first range of sizes and second composite particulates of a second range of sizes in a lateral gap region between beveled edges of the stack of semiconductor substrates, where a first median of the first range of sizes is greater relative to a second median of the second range of sizes. The method includes removing a stack of integrated circuit dies including the first integrated circuit die joined with the second integrated die from the stack of semiconductor substrates.

As described in greater detail above, some implementations described herein provide a method. The method includes forming a first integrated circuit die on a first semiconductor substrate. The method includes forming a second integrated circuit die on a second semiconductor substrate. The method includes forming a stack of semiconductor substrates by joining the first semiconductor substrate and the second semiconductor substrate. The method includes forming a supporting fill mixture including a sealant mixed with first composite particulates approximating a first shape and second composite particulates approximating a second shape in a lateral gap region between beveled edges of the stack of semiconductor substrates, where the second shape is other than the first shape. The method includes removing a stack of integrated circuit dies including the first integrated circuit die joined with the second integrated die from the stack of semiconductor substrates.

As described in greater detail above, some implementations described herein provide a method. The method includes joining two or more semiconductor substrates to form a stack including the two or more semiconductor substrates. The method includes forming a supporting fill mixture including first composite particulates and second composite particulates in a lateral gap region between beveled edges of the stack of two or more semiconductor substrates, where a first median of first range of sizes of the first composite particulates is greater relative to a second median of a second range of sizes of the second composite particulates. The method includes thinning a top semiconductor substrate of the stack of two or more semiconductor substrates.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first integrated circuit die on a first semiconductor substrate;
    forming a second integrated circuit die on a second semiconductor substrate;
    forming a stack of semiconductor substrates by joining the first semiconductor substrate and the second semiconductor substrate,
    forming a supporting fill mixture comprising a sealant mixed with first composite particulates of a first range of sizes and second composite particulates of a second range of sizes in a lateral gap region between beveled edges of the stack of semiconductor substrates,
        wherein a first median of the first range of sizes is greater relative to a second median of the second range of sizes; and
    removing a stack of integrated circuit dies comprising the first integrated circuit die joined with the second integrated die from the stack of semiconductor substrates.

2. The method of claim 1, wherein the first range of sizes corresponds to a range of approximately 0.7 microns to approximately 2.5 microns.

3. The method of claim 1, wherein the second range of sizes corresponds to a range of approximately 0.4 microns to approximately 1.0 microns.

4. The method of claim 1, wherein the lateral gap region comprises:
    an inner region, and
    an outer region, and
    wherein a modulus of elasticity of the supporting fill mixture within the inner region is lesser relative to a modulus of elasticity of the supporting fill mixture within the outer region.

5. The method of claim 1, wherein the sealant comprises:
    a polyimide material, an epoxy material, or a polymer material.

6. The method of claim 1, wherein the first composite particulates comprise:
    a ceramic composite material.

7. The method of claim 1, wherein the first composite particulates comprise:
    a zirconium tungsten phosphate composite material.

8. The method of claim 1, wherein the second composite particulates comprise:
    a silica material.

9. A method, comprising:
    forming a first integrated circuit die on a first semiconductor substrate;
    forming a second integrated circuit die on a second semiconductor substrate;
    forming a stack of semiconductor substrates by joining the first semiconductor substrate and the second semiconductor substrate;
    forming a supporting fill mixture comprising a sealant mixed with first composite particulates approximating a first shape and second composite particulates approximating a second shape in a lateral gap region between beveled edges of the stack of semiconductor substrates, wherein the second shape is other than the first shape; and
    removing a stack of integrated circuit dies comprising the first integrated circuit die joined with the second integrated die from the stack of semiconductor substrates.

10. The method of claim 9, wherein the first shape corresponds to an approximately round shape having a smooth curvature.

11. The method of claim 9, wherein the second shape corresponds to a multi-surfaced shape including at least one surface having a serrated profile.

12. The method of claim 9, wherein a ratio of a first concentration of the first composite particulates to a second concentration of the second composite particulates changes relative to a lateral position within the lateral gap region.

13. A method, comprising:
    joining two or more semiconductor substrates to form a stack including the two or more semiconductor substrates;
    forming a supporting fill mixture comprising first composite particulates and second composite particulates in a lateral gap region between beveled edges of the stack of two or more semiconductor substrates,
        wherein a first median of first range of sizes of the first composite particulates is greater relative to a second median of a second range of sizes of the second composite particulates; and
    thinning a top semiconductor substrate of the stack of two or more semiconductor substrates.

14. The method of claim 13, further comprising:
    scanning the lateral gap region to determine an approximate center of the lateral gap region prior to forming the supporting fill mixture in the lateral gap region.

15. The method of claim 13, wherein forming the supporting fill mixture comprises:
    forming the supporting fill mixture using a jet nozzle to deposit the supporting fill mixture.

16. The method of claim 13, wherein forming the supporting fill mixture comprises:
    forming the supporting fill mixture to include a first concentration of the first composite particulates within an inner region of the lateral gap region, and
    forming the supporting fill mixture to include a second concentration of the second composite particulates within the inner region of the lateral gap region,
    wherein the second concentration is greater relative to the first concentration.

17. The method of claim 13, wherein forming the supporting fill mixture comprises:
    forming the supporting fill mixture using a single deposition operation.

18. The method of claim 13, wherein forming the supporting fill mixture comprises:

using a first deposition operation to form a first percentage volume of the supporting fill mixture, and using a second deposition operation to form a second percentage volume of the supporting fill mixture.

19. The method of claim 18, wherein the using the first deposition operation to form the first percentage volume of the supporting fill mixture comprises:

using the first deposition operation to deposit a first sealant mixed with the first composite particulates, and wherein using the second deposition operation to form the second percentage of volume of the supporting fill mixture comprises:

using the second deposition operation to deposit a second sealant mixed with the second composite particulates.

20. The method of claim 19, wherein the first sealant and the second sealant include a same material.

\* \* \* \* \*